(12) United States Patent
Hooker et al.

(10) Patent No.: US 12,331,823 B2
(45) Date of Patent: Jun. 17, 2025

(54) ROTARY ACTUATOR

(71) Applicant: Schaeffler Technologies AG & Co. KG, Herzogenaurach (DE)

(72) Inventors: Craig Hooker, Indian Land, SC (US); Brad Derry, Rock Hill, SC (US); Peter Bartell, Fort mill, SC (US); Josiah Bailey, Charlotte, NC (US); Bartholomew Briggs, Fort Mill, SC (US)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 195 days.

(21) Appl. No.: 18/073,633

(22) Filed: Dec. 2, 2022

(65) Prior Publication Data

US 2023/0383820 A1 Nov. 30, 2023

Related U.S. Application Data

(60) Provisional application No. 63/346,356, filed on May 27, 2022.

(51) Int. Cl.
*F16H 57/023* (2012.01)
*B63B 39/06* (2006.01)
(Continued)

(52) U.S. Cl.
CPC ............ *F16H 57/023* (2013.01); *F16H 1/10* (2013.01); *F16H 19/08* (2013.01); *F16H 55/0833* (2013.01); *F16H 55/17* (2013.01); *F16H 57/02* (2013.01); *F16H 57/029* (2013.01); *B63B 39/06* (2013.01); *F16H 49/001* (2013.01);
(Continued)

(58) Field of Classification Search
CPC ............ F16H 57/02034; F16H 49/001; F16H 2057/02008; H02K 5/10; H02K 7/116; H02K 11/215
See application file for complete search history.

(56) References Cited

U.S. PATENT DOCUMENTS 3,924,555 A 12/1975 Napolitano
4,092,946 A * 6/1978 Kappas ................ B63H 20/007
475/149

(Continued)

FOREIGN PATENT DOCUMENTS

JP 2005080445 A 3/2005
JP 2008057702 A * 3/2008
(Continued)

*Primary Examiner* — Jake Cook
(74) *Attorney, Agent, or Firm* — Matthew V. Evans

(57) ABSTRACT

A rotary actuator includes a housing having a first end and a second end spaced from the first end along an axis. The housing defines a cavity extending circumferentially about the axis. An output shaft is arranged coaxially with the axis. The output shaft extends outwardly from the cavity through the first end. A drive system is disposed in the cavity and axially spaced from the first end. A gearbox is disposed in the cavity between the output shaft and the drive system. The gearbox is coupled to the drive system and the output shaft. A rotational controller is disposed in the cavity between the drive system and the second end. The rotational controller is configured to actuate the drive system to adjust an angular position of the output shaft.

20 Claims, 8 Drawing Sheets

(51) Int. Cl.
    *F16H 1/10*         (2006.01)
    *F16H 19/08*       (2006.01)
    *F16H 49/00*       (2006.01)
    *F16H 55/08*       (2006.01)
    *F16H 55/17*       (2006.01)
    *F16H 57/02*       (2012.01)
    *F16H 57/029*     (2012.01)
    *G01D 5/245*      (2006.01)
    *H02G 15/04*       (2006.01)
    *H02K 5/10*        (2006.01)
    *H05K 7/14*        (2006.01)

(52) U.S. Cl.
    CPC ............... *F16H 2055/176* (2013.01); *F16H 2057/02008* (2013.01); *F16H 2057/02034* (2013.01); *F16H 2057/02082* (2013.01); *G01D 5/245* (2013.01); *H02G 15/046* (2013.01); *H02K 5/10* (2013.01); *H05K 7/1427* (2013.01)

(56) References Cited

U.S. PATENT DOCUMENTS

| | | | |
|---|---|---|---|
| 10,358,202 B2 * | 7/2019 | Gil | .......... B63H 20/14 |
| 10,625,831 B2 | 4/2020 | Venables et al. | |
| 2011/0120073 A1 | 5/2011 | Flanary | |
| 2011/0201238 A1 | 8/2011 | Rott et al. | |
| 2015/0096436 A1 | 4/2015 | Venables et al. | |
| 2016/0121978 A1 | 5/2016 | Venables et al. | |
| 2018/0166942 A1 | 6/2018 | Aoi et al. | |
| 2018/0198351 A1 | 7/2018 | Akutsu et al. | |
| 2020/0002992 A1 * | 1/2020 | Sekine | ............ F16H 25/20 |

FOREIGN PATENT DOCUMENTS

| | | |
|---|---|---|
| KR | 20170084336 A | 7/2017 |
| KR | 20190127788 A | 11/2019 |
| WO | 2019021094 A1 | 1/2019 |
| WO | 2022101597 A1 | 5/2022 |

* cited by examiner

ROTARY ACTUATOR

CROSS-REFERENCE TO RELATED APPLICATIONS

This application claims the benefit of U.S. Provisional Patent Application No. 63/346,356, filed May 27, 2022, the disclosure of which is incorporated in its entirety by reference herein.

TECHNICAL FIELD

The present disclosure relates generally to a rotary actuator, and more specifically to a rotary actuator including a drive system and a rotational controller arranged in a one-piece housing.

BACKGROUND

Waves can interfere with a boat during operation and can cause the boat to rotate about one or more axes. That is, the boat may be subjected to rotational motion, e.g., roll, pitch and/or yaw, during operation on a waterway. A stabilizer system may be mounted to the boat to counteract the effects of the waves and stabilize the boat during operation on the waterway. For example, the stabilizer system can include a fin mounted to a rotary actuator. The rotary actuator can rotate the fin to the desired angular position that creates a pressure around the boat, which can reduce the interference from the waves, and thereby improve stability of the boat. Due to the rotary actuator being submerged during operation of the stabilizer system, it is desirable to provide alternate designs and configurations to minimize water intrusion into the rotary actuator.

SUMMARY

According to an example embodiment, a rotary actuator includes a hollow housing having a first end and a second end spaced from the first end along an axis. The hollow housing defines a cavity extending from the first end to the second end. An output shaft is arranged coaxially with the axis. The output shaft extends outwardly from the cavity through the first end. A drive system is disposed in the cavity and is drivably connected to the output shaft. A gearbox is disposed in the cavity and axially arranged between the output shaft and the drive system. The gearbox may be a strain wave gearbox. The gearbox is drivably connected to the drive system and the output shaft. A rotational controller is arranged in the cavity between the drive system and the second end. The rotational controller is configured to actuate the drive system to adjust an angular position of the output shaft.

In an example embodiment, the drive system and the gearbox may be arranged coaxially with the axis.

In an example embodiment, the housing may be constructed from one piece.

In an example embodiment, the rotary actuator may include a first seal disposed at the first end and a second seal disposed at the second end. The first and second seals may be configured to prevent fluid communication between the cavity and an environment around the housing via the respective ends.

In an example embodiment, the rotary actuator is designed to operate when it is submersed in a fluid such as salt water.

In an example embodiment, the drive system may include an electric motor having a rotor shaft. The drive system may further include a bearing housing defining a housing cavity extending axially through the bearing housing. The rotor shaft may extend partially through the housing cavity. The drive system may further include an encoder magnet connected to the rotor shaft and detectable by the rotational controller. The encoder magnet may be disposed within the housing cavity. The drive system may further include a shield covering the housing cavity. The shield may be disposed between the encoder magnet and the rotational controller. The bearing housing and the shield may be configured to prevent fluid communication through the cavity.

In an example embodiment, the rotational controller may be covered with a potting compound. The potting compound may fill the cavity around the rotational controller and seal against an inner surface of the housing.

In an example embodiment, the rotary actuator may include an idler shaft arranged coaxially with the axis. The idler shaft may extend outwardly from the cavity through the second end. The rotational controller may be disposed between the drive system and the idler shaft. The rotational controller may include a first sensor configured to detect the angular position of a rotor shaft of the electric motor and a second sensor configured to detect an angular position of the idler shaft. The first and second sensors may be axially spaced from each other. The first sensor and the second sensor may be disposed within the cavity and arranged coaxially with the axis.

In an example embodiment, the hollow housing includes a plurality of axial segments defining a plurality of inner diameters of the longitudinal cavity. A first segment surrounded by directly adjacent second and third segments has a larger inner diameter than corresponding diameters of the second and third segments. The rotational controller is housed within the first segment.

In an example embodiment, the hollow housing includes an opening arranged: i) between the first and second ends, and ii) transverse to the axis. An electrical cable extends through the opening and connects with the rotational controller.

DETAILED DESCRIPTION

Figure 1:
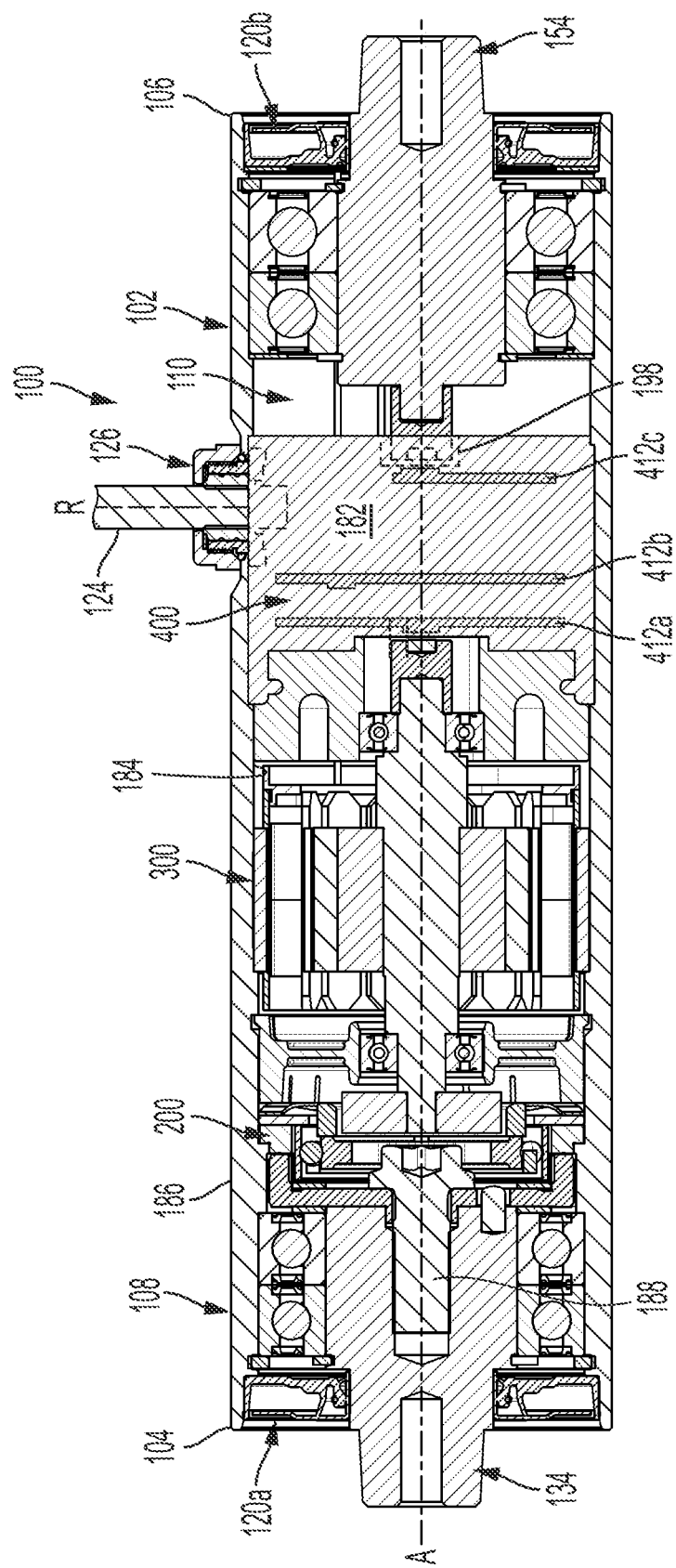
FIG. 1 illustrates a cross-sectional view along an axis of an exemplary rotary actuator.

Embodiments of the present disclosure are described herein. It should be appreciated that like drawing numbers appearing in different drawing views identify identical, or functionally similar, structural elements. Also, it is to be understood that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The terminology used herein is for the purpose of describing particular aspects only, and is not intended to limit the scope of the present disclosure. Unless defined otherwise, all technical and scientific terms used herein have the same meaning as commonly understood to one of ordinary skill in the art to which this disclosure belongs. Although any methods, devices or materials similar or equivalent to those described herein can be used in the practice or testing of the disclosure, the following example methods, devices, and materials are now described.

A rotary actuator may include a housing having multiple portions to separately house components of the rotary actuator. For example, one portion of the housing may house a controller, and a separate portion of the housing may house a electric motor. In such an example, the portions of the housing are sealed together, e.g., to prevent water intrusion into the housing. However, having numerous portions sealed together can increase a likelihood of water intrusion due to a manufacturing defect in one or more seals between respective portions.

Advantageously, a rotary actuator, in one exemplary embodiment of the disclosure, includes a housing defining a cavity. A drive system is arranged in the cavity. An output shaft is arranged coaxially with the drive system and extends from the cavity. A gearbox is arranged in the cavity and coaxially with the drive system. The gearbox is coupled to the drive system and the output shaft. A rotational controller is arranged in the cavity on an opposite side of the drive system than the gearbox. By arranging the components of the rotary actuator in the cavity, the rotary actuator eliminates sealed joints between multiple housing portions that house separate components, which can reduce a likelihood of water intrusion into the cavity.

With reference to the Figures, a rotary actuator 100 is generally shown. The rotary actuator 100 includes a housing 102 and a plurality of components housed, at least partially, therein. The housing 102 may be a unitary, i.e., one-piece, construction. Being a unitary construction eliminates joints between multiple housing components, which reduces a likelihood of water intrusion into the housing 102. The housing 102 may be any suitable material to withstand forces and environmental effects of being submerged under water, e.g., salt water. For example, the housing 102 may be a non-corrosive metal, such as aluminum, stainless steel, etc. The housing 102 may have any suitable coating, e.g., powder coating. The coating is applied externally to the housing 102 to reduce a likelihood of corrosion resulting from the housing 102 being submerged in water, e.g., salt water. Additionally, the coating may be applied internally to the housing 102.

With reference to FIG. 1, the housing 102 includes a first end 104 and a second end 106 spaced from the first end 104 along an axis A. The housing 102 includes a wall 108 extending along the axis A from the first end 104 to the second end 106. Additionally, the wall 108 extends annularly about the axis A. That is, the housing 102 has a tubular shape and could be described as a hollow housing. The wall 108 defines a cavity 110 extending circumferentially about the axis A and axially along the axis A. The wall 108 is open at the first end 104 and the second end 106. That is, the cavity 110 extends along the axis A through the first end 104 of the housing 102 and through the second end 106 of the housing 102. The components of the rotary actuator 100 are inserted through one of the first or second ends 104, 106 during assembly of the rotary actuator 100.

The wall 108 includes an inner surface 184 extending circumferentially about the axis A and an outer surface 186 extending circumferentially about the inner surface 184. The wall 108 has a thickness determined radially relative to the axis A from the inner surface 184 to the outer surface 186. The thickness may vary along the housing 102, e.g., from the first end 104 to the second end 106. For example, the outer surface 186 may have a substantially uniform diameter from the first end 104 to the second end 106 of the housing 102. Additionally, a diameter of the inner surface may vary from the first end 104 to the second end 106 of the housing 102, e.g., to receive and/or retain various components of the rotary actuator 100 in the housing 102.

Figure 2:
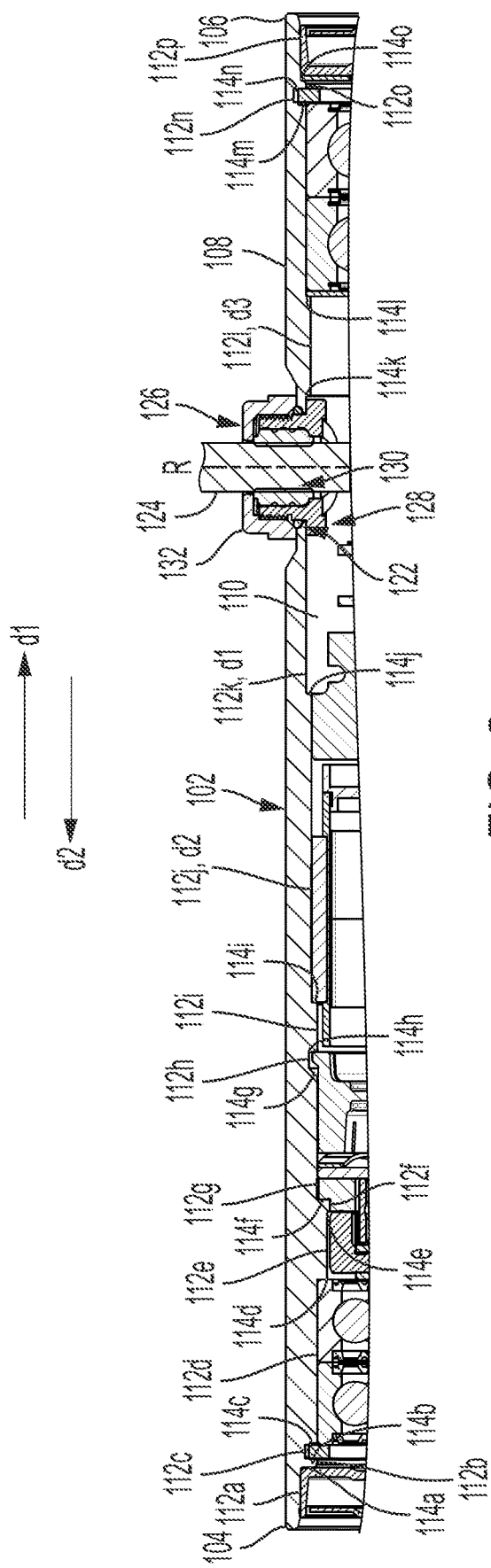
FIG. 2 illustrates a portion of the cross-sectional view of the rotary actuator of FIG. 1 without potting.

Turning to FIG. 2, the wall 108 may include a plurality of axial segments or portions 112 and a plurality of locator surfaces 114. Each locator surface 114 may extend from one respective axial portion 112 to another respective axial portion 112. Each axial portion 112 extends along some, but less than all of a length of the wall 108. As one example, the axial portions 112 may extend successively, i.e., one after the other, from the first end 104 to the second end 106 of the wall 108. In such an example, the locator surface 114 extending between adjacent axial portions 112 may extend radially relative to the axis A. As another example, the axial portions 112 may be axially spaced from each other. In such an example, the locator surface 114 extending between adjacent axial portions 112 may extend obliquely relative to the axis A and in a first direction d1 from the first end 104 towards the second end 106. As another example, the axial portions 112 may overlap adjacent axial portions 112. In such an example, the locator surface 114 extending between adjacent axial portions 112 may extend obliquely relative to the axis A and in a second direction d2, e.g., from the second end 106 to the first end 104, opposite the first direction d1. As yet another example, at least some of the axial portions 112 may extend successively, at least some of the axial portions 112 may overlap one or more adjacent axial portions 112, and/or at least some of the axial portions 112 may be axially spaced from one or more adjacent axial portions 112.

The wall 108 has a different thickness at each axial portion 112 relative to the immediately adjacent axial portion(s) 112. That is, each axial portion 112 is defined by a substantially uniform thickness. Each axial portion 112 may be sized, i.e., extend along the axis A, to engage one or more components of the rotary actuator 100. As one example, one or more axial portions 112 may radially constrain one or more components of the rotary actuator 100. In other words, one or more axial portions 112 may radially align the component(s) relative to the axis A. The component(s) may abut the axial portion(s) 112 circumferentially about the axis A. For example, the axial portion(s) 112 may be non-rotatably connected, e.g., via a press-fit connection, to the respective component(s). As another example, the axial portion(s) 112 may engage the component(s) via a slip-fit connection. As used herein, "non-rotatably connected" means that the components are connected so that whenever one of the components rotate, all the components rotate; and relative rotation between the components is not possible.

Additionally, or alternatively, the locator surface 114 between adjacent axial segments or portions 112 may axially constrain, i.e., limit or prevent movement along the axis A, one or more components engaged with the adjacent axial portions 112. In other words, the locator surface(s) 114 may position the component(s) relative to the first and second ends 104, 106 of the housing 102. For example, the locator surface(s) 114 may axially constrain one or more components in the first direction d1 or the second direction d2.

A first axial portion 112a may extend from the first end 104 of the housing 102 to a first locator surface 114a. The first locator surface 114a may extend radially inward relative to the axis A from the first axial portion 112a to a second axial portion 112b. The first locator surface 114a axially constrains a first seal 120a in the first direction d1. The first axial portion 112a radially constrains the first seal 120a.

The second axial portion 112b may extend from the first locator surface 114a to a second locator surface 114b. The second locator surface 114b may extend radially relative to the axis A outward from the second axial portion 112b to a third axial portion 112c. The second locator surface 114b axially constrains an outer retainer 116 in the second direction d2.

The third axial portion 112c may be disposed radially inward of the first axial portion 112a. The third axial portion 112c may extend from the second locator surface 114b to a third locator surface 114c. The third locator surface 114c may extend radially inward relative to the axis A from the third axial portion 112c to a fourth axial portion 112d. The third axial portion 112c may be designed, i.e., sized and shaped, to receive the outer retainer 116. That is, the third axial portion 112c may extend along the axis A such that the outer retainer 116 can be inserted between the second and third locator surfaces 114b, 114c. The third locator surface 114c axially constrains the outer retainer 116 in the first direction d1. The third axial portion 112c may radially constrain the outer retainer 116.

The fourth axial portion 112d may extend from the third locator surface 114c to a fourth locator surface 114d. The fourth axial portion 112d may be radially inward relative to the axis A from the third axial portion 112c to a fifth axial portion 112e. The fourth axial portion 112d may, for example, be disposed radially inward from the second axial portion 112b. Alternatively, the fourth axial portion 112d may be radially aligned with the second axial portion 112b. The fourth locator surface 114d may extend radially inward from the fourth axial portion 112d. The fourth locator surface 114d axially constrains an output bearing 150 in the first direction d1 within the cavity 110. The fourth axial portion 112d radially constrains the output bearing 150.

The fifth axial portion 112e may extend from the fourth locator surface 114d to a fifth locator surface 114e. The fifth locator surface 114e may extend radially inward relative to the axis A from the fifth axial portion 112e to a sixth axial portion 112f.

The sixth axial portion 112f may extend from the fifth locator surface 114e to a sixth locator surface 114f. The sixth locator surface 114f may extend radially outward relative to the axis A from the sixth axial portion 112f to a seventh axial portion 112g. The sixth locator surface 114f may axially constrain a gearbox 200 in the second direction d2. Additionally, the sixth locator surface 114f may radially constrain a fixed gear 202 of the gearbox 200 (as discussed further below).

The seventh axial portion 112g may extend from the sixth locator surface 114f to a seventh locator surface 114g. The seventh locator surface 114g may extend obliquely relative to the axis A from the seventh axial portion 112g to an eighth axial portion 112h. For example, the seventh locator surface 114g may extend radially outward and in the first direction d1 from the seventh axial portion 112g to the eighth axial portion 112h. In such an example, the eighth axial portion 112h may be axially offset, e.g., spaced, from the seventh axial portion 112g. The seventh axial portion 112g may radially constrain the gearbox 200, a resilient member 152, and a first drive bearing housing 342. The seventh locator surface 114g may axially constrain an extension 348 of the first drive bearing housing 342 in the second direction d2.

The eighth axial portion 112h may extend from the seventh locator surface 114g to an eighth locator surface 114h. The eighth locator surface 114h may extend radially inward relative to the axis A from the eighth axial portion 112h to a ninth axial portion 112i. Additionally, the eighth axial portion 112h may be designed to permit axial movement of the extension 348, e.g., to allow for thermal contraction and/or expansion of the extension 348 during operation of the rotary actuator 100. That is, the eighth axial portion 112h may extend farther along the axis A than the extension 348. The eighth locator surface 114h axially constrains the extension 348 in the first direction d1.

The ninth axial portion 112i may be radially aligned with the seventh axial portion 112g. The ninth axial portion 112i may extend from the eighth locator surface 114h to a ninth locator surface 114i. The ninth locator surface 114i may extend radially outward relative to the axis A from the ninth axial portion 112i to a tenth axial portion 112j. The ninth locator surface 114i may be designed to axially constrain an electric motor 302 in the second direction d2.

The tenth axial portion 112j may extend from the ninth locator surface 114i to a tenth locator surface 114j. The tenth locator surface 114j may extend radially outward relative to the axis A from the tenth axial portion 112j to an eleventh axial portion 112k. The tenth axial portion 112j radially constrains the electric motor 302 and a second drive bearing housing 352.

The eleventh axial portion 112k may extend from the tenth locator surface 114j to an eleventh locator surface 114k. The eleventh locator surface 114k may extend radially inward relative to the axis A from the eleventh axial portion 112k to a twelfth axial portion 112l.

The eleventh axial portion 112k includes an opening 122 extending radially through the wall 108. The opening 122 extends transversely from axis A. An electrical cable 124 extends through the opening 122. The electrical cable 124 includes one or more wires that: i) provide power to the rotational controller 400, ii) facilitate electronic communication with the rotational controller 400, and iii) facilitate a ground connection between the inner surface 184 of the housing 102 and the boat. A cable gland 126 is disposed in the opening 122. The cable gland 126 includes a body 128 extending through the opening 122 and a cover 132. The cable gland 126, i.e., the body 128 and the cover 132, defines a cable cavity 130 extending circumferentially about an axis R transverse to the axis A. The electrical cable 124 extends through the cable cavity 130. That is, the cable cavity 130 is designed, i.e., sized and shaped, to receive the electrical cable 124. Specifically, the cable cavity 130 is designed to abut the electrical cable 124 entirely around the axis R.

The body 128 includes a base disposed in the cavity 110 of the housing 102. The base abuts the eleventh locator surface 114k. That is, the eleventh locator surface 114k axially constrains the cable gland 126 in the first direction d1. The body 128 includes a wall extending axially from the base through the opening 122. The wall abuts the housing 102 entirely circumferentially about the opening 122. The base extends radially outward relative to the axis R from the wall. That is, the base has a larger diameter than the opening 122.

The wall of the body 128 includes a plurality of extensions extending radially outward from the wall relative to the axis R. The extensions are disposed external to the cavity 110. The extensions extend circumferentially about, i.e., entirely around, the wall relative to the axis R. That is, the wall has a larger diameter than the opening 122 at each extension. Each extension may extend a same or different amount radially outward from the wall relative to the axis R. The extensions may extend any suitable amount radially outward from the wall relative to the axis R.

The cover 132 covers the body 128. For example, the cover 132 abuts the housing 102 entirely around the body 128. The cover 132 may compress the extensions radially inward and/or axially towards the housing 102 relative to the axis R, which can assist in sealing the opening 122.

Additionally, a seal, e.g., an o-ring or the like, may extend circumferentially about the body 128. The seal may be compressed by the cover 132 against the body 128 and the housing 102 to further assist in sealing the opening 122. That is, the cover 132, the seal, and the body 128 seal the opening 122 around the electrical cable 124. In other words, the cable gland 126 prevents fluid communication between the cavity 110 and the environment around the housing 102 via the opening 122. The cable gland 126, i.e., the body 128 and the cover 132, may be any suitable material, e.g., rubber, plastic, etc.

The twelfth axial portion 112l may extend from the eleventh locator surface 114k to a twelfth locator surface 114l. The twelfth locator surface 114l may extend radially outward relative to the axis A from the twelfth axial portion 112l to a thirteenth axial portion 112m. The twelfth locator surface 114l axially constrains an idler bearing 172 in the second direction d2.

The thirteenth axial portion 112m may extend from the twelfth locator surface 114l to a thirteenth locator surface 114m. The thirteenth locator surface 114m may extend radially outward relative to the axis A from the thirteenth axial portion 112m to a fourteenth axial portion 112n. The thirteenth locator surface 114m axially constrains an outer idler retainer 176 in the second direction d2. The fourteenth axial portion 112n may radially constrain the outer idler retainer 176.

The fourteenth axial portion 112n may extend from the thirteenth locator surface 114m to a fourteenth locator surface 114n. The fourteenth locator surface 114n may extend radially outward relative to the axis A from the fourteenth axial portion 112n to a fifteenth axial portion 112o. The fourteenth axial portion 112n may be designed, i.e., sized and shaped, to receive the outer idler retainer 176. That is, the fourteenth axial portion 112n may extend along the axis A such that the outer idler retainer 176 can be inserted between the thirteenth and fourteenth locator surfaces 114m, 114n, which define a groove 175, during assembly of the rotary actuator 100. The fourteenth locator surface 114n axially constrains the outer idler retainer 176 in the first direction d1.)

The fifteenth axial portion 112o may extend from the fourteenth locator surface 114n to a fifteenth locator surface 114o. The fifteenth locator surface 114o may extend radially outward relative to the axis A from the fifteenth axial portion 112o to a sixteenth axial portion 112p. The fifteenth locator surface 114o axially constrains a second seal 120b in the second direction d2. The sixteenth axial portion 112p may extend from the fifteenth locator surface 114o to the second end 106 of the housing 102. The sixteenth axial portion 112p radially constrains the second seal 120b.

Figure 3:
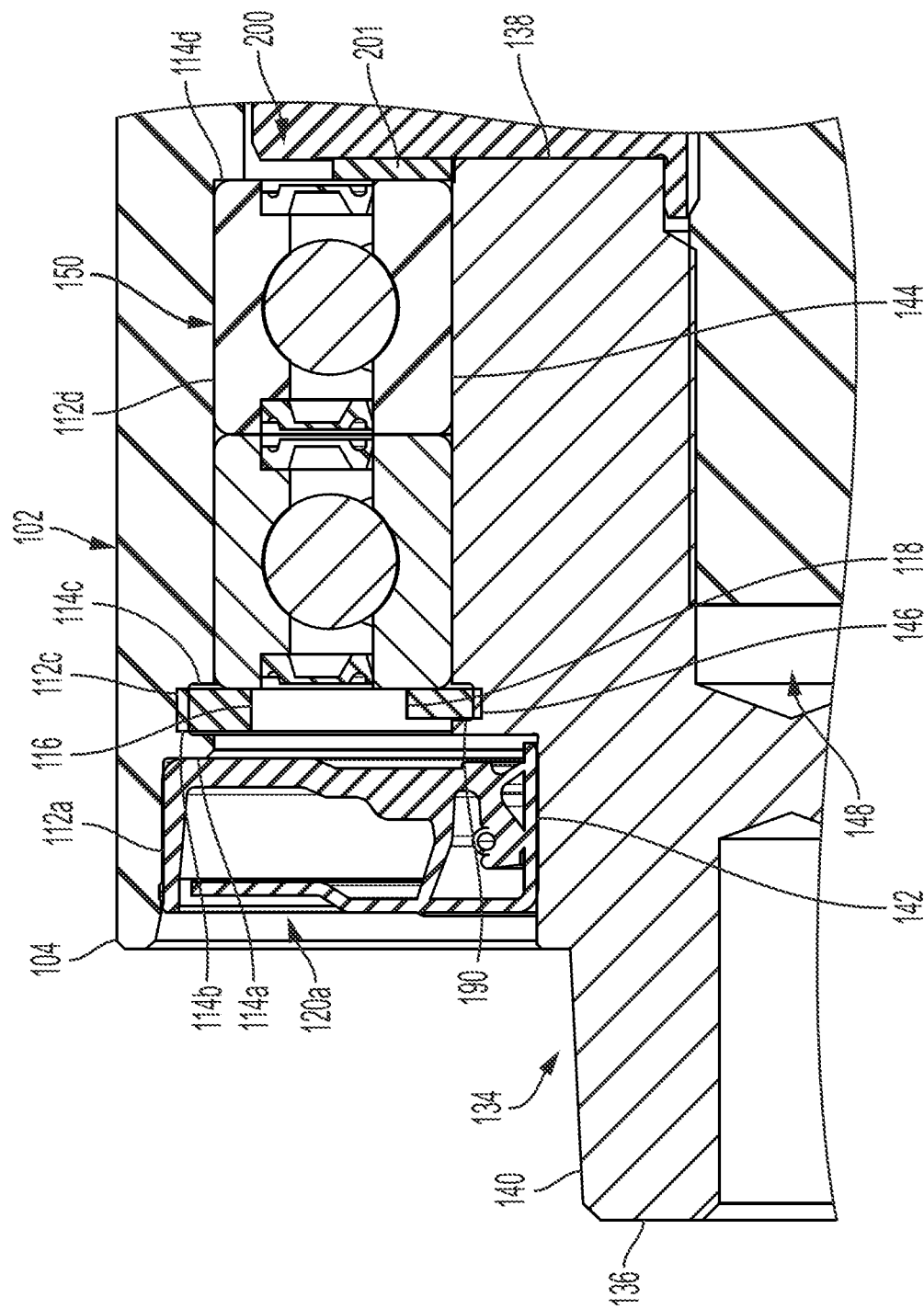
FIG. 3 illustrates a magnified cross-sectional view of a portion of the rotary actuator of FIG. 1.

Turning now to FIG. 3, the rotary actuator 100 includes an output shaft 134 arranged coaxially with the axis A. The output shaft 134 may be any suitable material to withstand forces and environmental effects of being submerged under water, e.g., salt water. For example, the output shaft 134 may be a non-corrosive metal, such as stainless steel.

The output shaft 134 extends outwardly through the first end 104 of the housing 102. That is, the output shaft 134 is arranged partially within the cavity 110. The output shaft 134 includes a first end 136 and a second end 138 spaced from the first end 136 along the axis A. The output shaft 134 is step-like in cross-section and includes a first portion 140, a second portion 144, and a sealing portion 142 each extending circumferentially about the axis A. The first portion 140 extends from the first end 136 to the sealing portion 142, and the second portion 144 extends from the sealing portion 142 to the second end 138. The first portion 140 may be connected to a component, e.g., a fin, a blade, etc., of a boat stabilizer system. In such an example, the rotary actuator 100 can be actuated to adjust an angular position of the fin to create a pressure that interferes with waves around the boat thereby stabilizing the boat during operation on a waterway.

The sealing portion 142 is disposed radially outward of the first portion 140 relative to the axis A. The sealing portion 142 extends along the axis A from the first portion 140 to the second portion 144. The sealing portion 142 may be designed, i.e., sized and shaped, to engage the first seal 120a.

The second portion 144 is disposed radially outward of the sealing portion 142 relative to the axis A. The second portion 144 may include a groove 146 disposed between the second end 138 of the output shaft 134 and the first portion 140. The groove 146 may extend circumferentially about the axis A, i.e., entirely around the second portion 144. The groove 146 may be axially aligned with the third axial portion 112c. The groove 146 may be designed to receive an inner retainer 118. That is, the groove 146 may extend along the axis A such that the inner retainer 118 can be inserted in the groove 146 during assembly of the rotary actuator 100. The groove 146 axially constrains the inner retainer 118 in the first and second directions d1, d2 and may radially constrain the inner retainer 118.

The second portion 144 includes a recess 148 extending from the second end 138 of the output shaft 134 towards the sealing portion 142 of the output shaft 134. The recess 148 is axially spaced from the first portion 140. The recess 148 extends circumferentially about the axis A. The recess 148 may be threaded, i.e., include threads, to facilitate a non-rotatable attachment of an output gear 232 of the gearbox 200 to the output shaft 134.

The output shaft 134 is rotationally supported by an output bearing 150. The output bearing 150 is arranged coaxially with the axis A. The output bearing 150 may extend annularly about the axis A. The output bearing 150 may be positioned between the second end 138 of the output shaft 134 and the groove 146. The output bearing 150 may be any suitable type of bearing, including, but not limited to, a single row ball bearing, a double row ball bearing, an angular contact ball bearing, or two single row ball bearings, as shown. The output bearing 150 may be press-fit onto the outer surface of the second portion 144 of the output shaft 134. The inner retainer 118 may axially constrain the output bearing 150 in the second direction d2. The output bearing 150 can either have a slip fit connection or a press-fit connection with the fourth axial portion 112*d*.

The outer retainer 116 is engaged with the housing 102 and the output bearing 150. The outer retainer 116 and the inner retainer 118 may be any suitable type of retainer, e.g., a snap ring. The outer retainer 116 and the inner retainer 118 may be a same or different type of retainer.

As set forth above, the outer retainer 116 and the inner retainer 118 axially constrain the output shaft 134, and specifically, the output bearing 150, in the second direction d2 within the cavity 110. To axially constrain the output bearing 150, the housing 102 and the output shaft 134 may be crimped after installation of the inner and outer retainers 116, 118. Crimping the housing 102 and the output shaft 134 minimizes an axial clearance between the outer retainer 116 and the second and third locator surfaces 114*b*, 114*c* and an axial clearance between the groove 146 and the inner retainer 118, which can minimize stack-up tolerances of components associated with the output shaft 134 relative to the housing 102. For example, the outer retainer 116 can be compressed between the second and third locator surfaces 114*b*, 114*c*, and the inner retainer 118 can be compressed between walls of the groove 146. Axially controlling the output bearing 150 can reduce axial clearance between the output shaft 134 and the gearbox 200.

The first seal 120*a* of the rotary actuator 100 is disposed at the first end 104 of the housing 102 and covers the first end 104. That is, the first seal 120*a* extends radially from the output shaft 134 to the housing 102. The first seal 120*a* may be press-fit into the housing 102 and onto the output shaft 134 such that the output shaft 134 sealingly rotates relative to the housing 102. The first seal 120*a* prevents fluid communication between the cavity 110 and an environment around the housing 102 through the first end 104. The first seal 120*a* may be any suitable type of seal. The first seal 120*a* may include one or more retention members, e.g., radial springs, that assist in maintaining contact between the first seal 120*a* and the output shaft 134 and/or between the first seal 120*a* and the housing 102. The first seal 120*a* may be any suitable material or combination of materials, e.g., rubber, metal, etc.

The rotary actuator 100 may include grease, or the like, disposed in the cavity 110 adjacent to the first seal 120*a*. The grease may be any suitable type of water-resistant grease. The grease may decrease a likelihood of water intrusion into the cavity 110.

Figure 4:
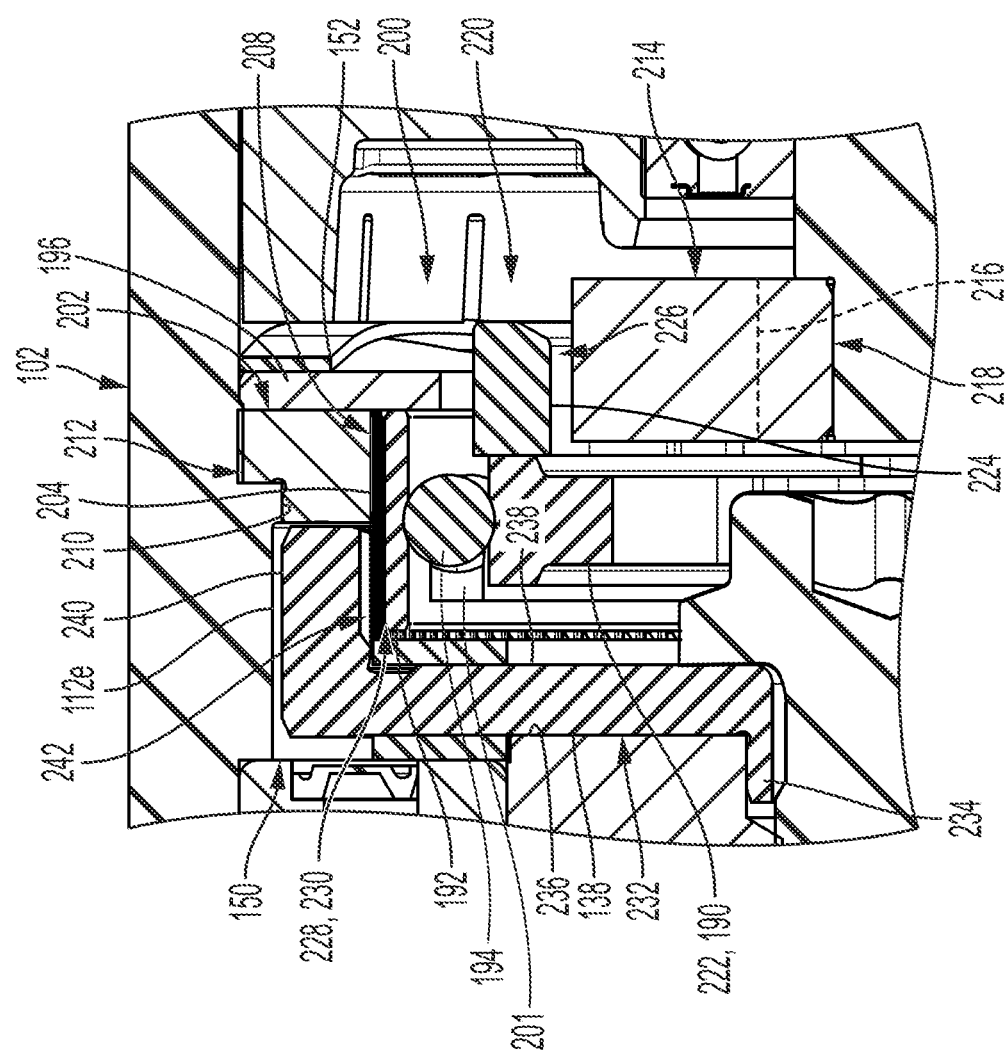
FIG. 4 illustrates a magnified cross-sectional view of another portion of the rotary actuator of FIG. 1.

Turning now to FIG. 4, the gearbox 200 may be a strain wave gearbox 200, as shown in the Figures and discussed herein. However, the gearbox 200 may be any other suitable type of gearbox, e.g., a planetary gearbox, etc.

The strain wave gearbox 200 is disposed in the cavity 110. The strain wave gearbox 200 is engaged with the output shaft 134. Additionally, the strain wave gearbox 200 is engaged with a drive system 300. Specifically, the strain wave gearbox 200 is configured to receive a torque from the drive system 300. Additionally, the strain wave gearbox 200 is configured to increase the torque, e.g., via a gear ratio, and output the increased torque to the output shaft 134. The strain wave gearbox 200 can be configured with a specified gear ratio, e.g., 66 to 1. The specified gear ratio can be determined empirically, e.g., based on testing that allows for determining a gear ratio that can increase a torque that has a value within an input range, e.g., corresponding to characteristics of an electric motor, to have a value within an output range, e.g., specified by a manufacturer of the rotary actuator 100.

The strain wave gearbox 200 includes a fixed gear 202 non-rotatably connected to the housing 102. The fixed gear 202 includes an internal tooth system 208 on the inner surface 204. The internal tooth system 208 includes a plurality of teeth extending radially inward relative to the axis A from the inner surface 204. Each tooth may extend from the first axial side to the second axial side of the fixed gear 202. The teeth in the internal tooth system 208 may be substantially identical to each other.

The fixed gear 202 includes an outer surface 210 extending from the first axial side to the second axial side of the fixed gear 202. The outer surface 210 extends circumferentially about the inner surface 204. That is, the outer surface 210 is radially outward of the inner surface 204 relative to the axis A. The fixed gear 202 includes an external tooth system 212 on the outer surface 210. The external tooth system 212 includes a plurality of teeth and ridges that are circumferentially spaced about the axis A. The teeth and the ridges may extend from the second axial side towards the first axial side. For example, the teeth and the ridges may be spaced from the first axial side.

The fixed gear 202 may be non-rotatably connected to the housing 102. For example, the external tooth system 212 may engage the sixth locator surface 114*f* and/or the seventh axial portion 112*g*. During assembly, the fixed gear 202 may be inserted into the cavity 110 through the second end 106 until the fixed gear 202 abuts the sixth locator surface 114*f*. The teeth and/or the ridges may be designed such that the fixed gear 202 deforms the sixth locator surface 114*f* and/or the seventh axial portion 112*g*. In this situation, material of the sixth locator surface 114*f* and/or the seventh axial portion 112*g* may be pressed between the teeth and the ridges of the fixed gear 202, which prevents the fixed gear 202 from moving axially or radially relative to the housing 102.

The strain wave gearbox 200 includes a drive gear 214. The drive gear 214 is configured to transfer a torque from the drive system 300 to the wave generator 220 (as discussed further below). The drive gear 214 includes a body 216 extending annularly about the axis A. The body 216 defines a cavity 218 arranged coaxially with the axis A. The cavity 218 is designed, i.e., sized and shaped, to receive a component of the drive system 300 (as discussed below). The drive gear 214 includes one or more paddles extending radially outward from the body 216. The drive gear 214 may be any suitable material to receive and transfer torque from the drive system 300, e.g., metal.

The strain wave gearbox 200 includes a wave generator 220. The wave generator 220 is arranged coaxially with the axis A. The wave generator 220 is circumferentially surrounded by the fixed gear 202 relative to the axis A. The wave generator 220 includes a bearing 222. The bearing 222 includes an inner ring 190, an outer ring 192, a cage 201 therebetween, and a plurality of rollers or balls 194 supported in the cage 201 and circumferentially spaced from each other. The inner ring 190 has a non-circular, e.g., elliptical, contour. The outer ring 192 is configured to be flexible relative to the inner ring 190, such that the outer ring 192 adapts to the non-circular shape of the inner ring 190.

The wave generator 220 includes a coupling 224 non-rotatably connected to the inner ring 190, e.g., via fasteners. The coupling 224 defines an opening 226 that is coaxially aligned with the axis A. The opening 226 extends axially through the coupling 224. The opening 226 is designed, i.e., sized and shaped, to receive the drive gear 214. The coupling 224 is configured to transfer the torque to the inner ring of the bearing 222 while reducing or preventing torque backlash. The coupling 224 may be referred to as an Oldham coupling. The coupling 224 may be any suitable material, e.g., plastic, rubber, etc.

The wave generator 220 includes a flex ring 228 extending annularly about the axis A. The flex ring 228 extends circumferentially about the outer ring 192 of the bearing 222. Stated otherwise, the flex ring 228 is disposed radially outward from the outer ring 192. The flex ring 228 may be configured to adapt to the shape of the outer ring 192. The flex ring 228 may be frictionally engaged with the outer ring 192. For example, the flex ring 228 may be rotated by the outer ring 192 based on frictional forces therebetween. The flex ring 228 may be any suitable material, e.g., plastic, rubber, etc.

The flex ring 228 includes an external tooth system 230. The external tooth system 230 includes a plurality of teeth extending radially outward from the flex ring 228. The teeth are spaced from each other circumferentially about the axis A. The teeth may extend from one axial side to another axial side of the flex ring 228. The external tooth system 230 of the flex ring 228 is engaged with the internal tooth system 208 of the fixed gear 202. The teeth of the internal tooth system 208 may extend partially across the flex ring 228 relative to the axis A. The number of teeth of the external tooth system 230 corresponds to the number of teeth of the internal tooth system 208. Thus, the flex ring 228 maintains, i.e., keeps, an angular position relative to the fixed gear 202.

The wave generator 220 may include a cover 196 extending annularly about the axis A. The cover 196 may circumferentially surround the coupling 224 relative to the axis A. The cover 196 may be designed to cover the cage and rollers, e.g., to prevent debris from entering the bearing 222. The cover 196 may be non-rotatably connected to the housing 102, e.g., via a press-fit connection. For example, the cover 196 may abut the seventh axial portion 112g. By radially extending to the seventh axial portion 112g, the cover 196 may axially constrain the bearing 222 in the first direction d1. The cover 196 may be any suitable material, e.g., metal.

The strain wave gearbox 200 includes an output gear 232. The output gear 232 includes an inner surface extending circumferentially about the axis A. The inner surface defines a projection 234. The projection 234 is disposed within the recess 148 of the output shaft 134. The projection 234 has a diameter corresponding to the diameter of the recess 148. Specifically, the recess 148 is designed to receive a fastener, such as a bolt 188. The bolt 188 may threadedly engage the recess 148 to non-rotatably connect the strain wave gearbox 200, i.e., the output gear 232, to the output shaft 134.

The output gear 232 includes a first axial side 236 and a second axial side 238. The first axial side 236 abuts the second end 138 of the output shaft 134. The bearing 222 may abut the second axial side 238. That is, the output gear 232 is arranged axially between the output shaft 134 and the wave generator 220.

The output gear 232 includes an outer surface extending circumferentially about the inner surface. The outer surface is radially spaced from the housing 102, e.g., to allow rotation of the output gear 232 relative to the housing 102. For example, the outer surface may be radially inward of the fifth axial portion 112e. The output gear 232 includes an extension 240 extending axially from the second axial side 238 at the outer surface. The extension 240 extends in the first direction d1, i.e., towards the drive system 300. The extension 240 extends circumferentially about the axis A.

The extension includes an internal tooth system 242 having a plurality of teeth extending radially inward towards the axis A. The internal tooth system 242 is configured to engage the external tooth system 230 of the flex ring 228. The internal tooth system 242 may be spaced from the internal tooth system 208 of the fixed gear 202 relative to the axis A. That is, the internal tooth system 242 may extend partially across the flex ring 228 relative to the axis A. The number of teeth of the internal tooth system 242 is different from the number of teeth of the external tooth system 230. The difference between the number of teeth in the corresponding tooth systems 242, 230 results in a slight pivoting of the output gear 232 relative to the housing 102. The strain wave gearbox 200 may be configured such that the output gear 232 rotates in a same direction as the electric motor 302.

The rotary actuator 100 may include any suitable number of spacers arranged to axially control positions of various components within the rotary actuator 100. For example, as shown in FIG. 3, the rotary actuator 100 may include a spacer 201 disposed between the output bearing 150 and the strain wave gearbox 200, e.g., the output gear 232. The spacers may be any suitable material, e.g., metal. The spacers may have any suitable thickness, e.g., determined along the axis A.

Figure 5:
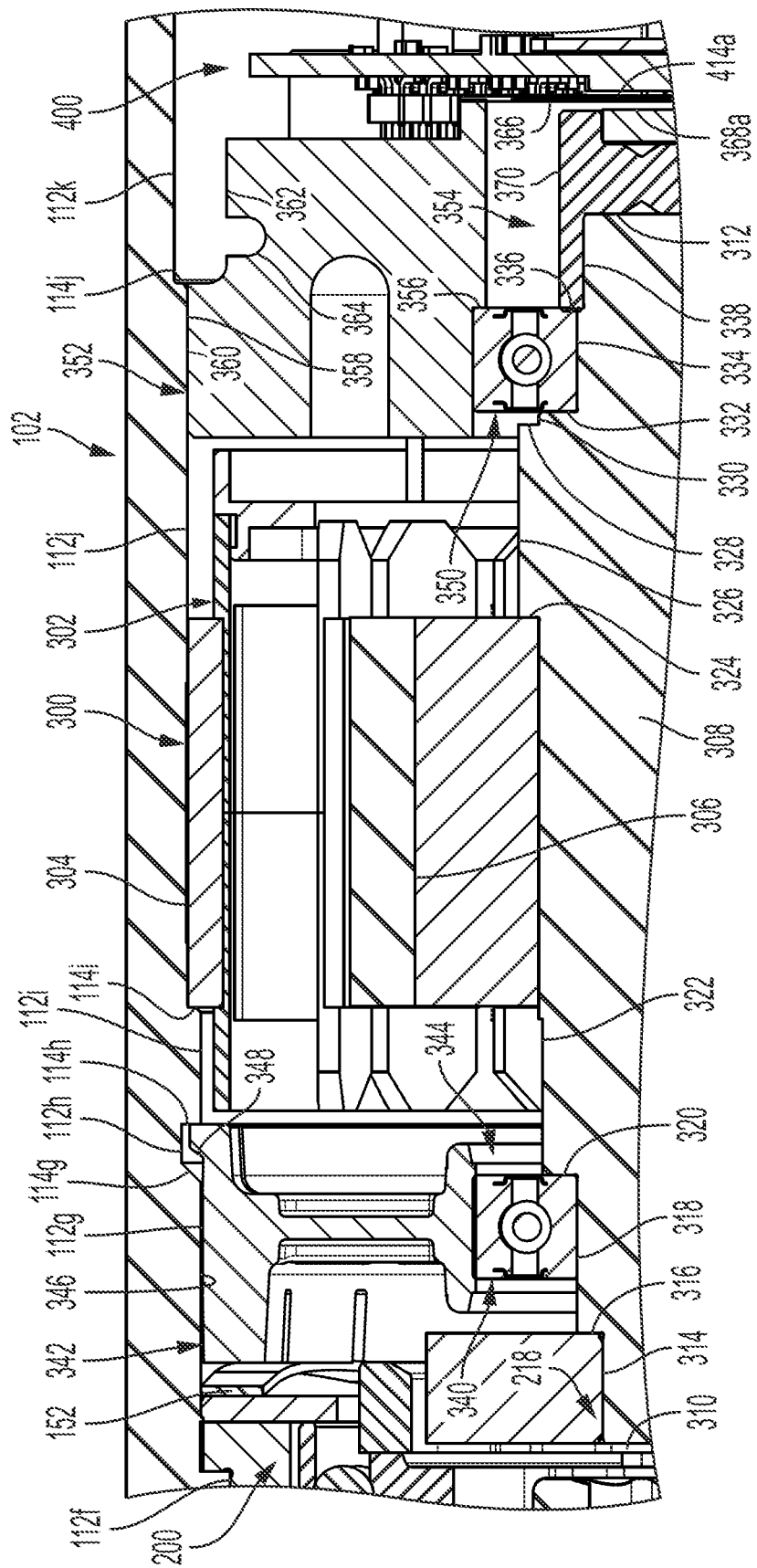
FIG. 5 illustrates a magnified cross-sectional view of another portion of the rotary actuator of FIG. 1.

Turning now to FIG. 5, the drive system 300 is engaged with the gearbox 200 as discussed further below. The drive system 300 is disposed in the cavity 110. The gearbox 200 is disposed between the output shaft 134 and the drive system 300.

The drive system 300 includes an electric motor 302. The electric motor 302 includes a fixed stator 304 and a rotatable rotor 306. The stator 304 is non-rotatably connected to the housing 102, e.g., via a press-fit connect, adhesive, etc.

Electric power is provided to windings of the stator 304, creating magnetic forces that exert torque on the rotor 306. The electric motor 302 may be, for example, an alternating current electric motor such as a permanent magnet synchronous motor. With a synchronous alternating current electric motor, the rotational speed of the rotor 306 is adjusted by adjusting the frequency of the electric current using an inverter. With other types of electric motors, a speed or position feedback signal may be required.

The rotor shaft 308 includes a first end 310 and a second end 312 spaced from the first end 310 along the axis A. The rotor shaft 308 may be elongated from the first end 310 to the second end 312. The rotor shaft 308 includes a first portion 314 extending from the first end 310 to a first shoulder 316. The first shoulder 316 extends radially outward from the first portion 314. The first portion 314 may designed to engage the gearbox 200. For example, the first portion 314 may be disposed in the cavity 218 of the drive gear 214. In such an example, the first portion 314 may be non-rotatably connected to the drive gear 214, such that rotation of the rotor shaft 308 rotates the drive gear 214. The first shoulder 316 may abut the drive gear 214, which can axially constrain the rotor shaft 308 in the second direction d2. According to this drive arrangement, the rotor shaft 308 could also be referred to as an input shaft to the gearbox 200.

The rotor shaft 308 includes a second portion 318 extending from the first shoulder 316 to a second shoulder 320. The second portion 318 is disposed radially outward from the first portion 314. The second shoulder 320 extends radially outward from the second portion 318.

The rotor shaft 308 includes a third portion 322 extending from the second shoulder 320 to a third shoulder 324. The third portion 322 is disposed radially outward from the second portion 318. The third shoulder 324 extends radially outward from the third portion 322. The rotor 306 abuts the third shoulder 324. That is, the third shoulder 324 axially constrains the rotor 306 in the first direction d1. At least a portion of the third portion 322 is disposed within the rotor 306.

The rotor shaft 308 includes a fourth portion 326 extending from the third shoulder 324 to a fourth shoulder 328. The fourth portion 326 is disposed radially outward from the third portion 322. The fourth shoulder 328 extends radially inward from the fourth portion 326.

The rotor shaft 308 includes a fifth portion 330 extending from the fourth shoulder 328 to a fifth shoulder 332. The fifth portion 330 is disposed radially inward from the fourth portion 326. The fifth shoulder 332 extends radially inward from the fifth portion 330. The fifth portion 330 may be designed to create axial clearance between the fourth portion 326 of the rotor shaft 308 and a second drive bearing 350, e.g., to allow rotation of an inner ring relative to an outer ring of the second drive bearing 350.

The rotor shaft 308 includes a sixth portion 334 extending from the fifth shoulder 332 to a sixth shoulder 336. The sixth portion 334 is disposed radially inward from the fifth portion 330. The sixth shoulder 336 extends radially inward from the sixth portion 334. The sixth portion 334 may be designed, i.e., sized and shaped, to receive the second drive bearing 350.

The rotor shaft 308 includes a seventh portion 338 extending from the sixth shoulder 336 to the second end 312 of the rotor shaft 308. The seventh portion 338 is disposed radially inward of the sixth portion 334.

The drive system 300 includes a sleeve 370 arranged on the rotor shaft 308. The sleeve 370 may be non-rotatably connected to the rotor shaft 308, e.g., via a press-fit connection. The sleeve 370 includes a recess designed to receive a first encoder magnet 368a.

The first encoder magnet 368a is non-rotatably connected to the sleeve 370. For example, the first encoder magnet 368a may be connected to the sleeve 370 in the recess, e.g., via a press-fit connection, adhesive, etc. The first encoder magnet 368a has diametric polarity, i.e., poles spaced from each other diametrically across the first encoder magnet 368a. The first encoder magnet 368a may be arranged coaxially with the axis A. The sleeve 370 may be brass or any other suitable material that does not create magnetic interference.

The drive system 300 includes a first drive bearing 340 and a first drive bearing housing 342. The rotor shaft 308 is rotationally supported by the first drive bearing 340. The first drive bearing 340 is non-rotatably connected to the second portion 318 of the rotor shaft 308. For example, the first drive bearing 340 may be press-fit onto the rotor shaft 308. The first drive bearing 340 abuts the second shoulder 320. That is, the second shoulder 320 axially constrains the first drive bearing 340 in the first direction d1. The first drive bearing 340 may be any suitable type of bearing, e.g., a single row roller bearing.

The first drive bearing housing 342 houses the first drive bearing 340. For example, the first drive bearing housing 342 may extend annularly about the axis A. The first drive bearing housing 342 defines a first housing cavity 344. The first housing cavity 344 extends circumferentially about the axis A. Additionally, the first housing cavity 344 may extend from a first axial side to a second axial side of the first drive bearing housing 342. The first drive bearing 340 is arranged within the first housing cavity 344. The first drive bearing 340 may be slip-fit or press-fit into the first housing cavity 344, e.g., to allow rotation of the rotor shaft 308 relative to the first drive bearing housing 342. The first drive bearing housing 342 may be any suitable material, e.g., plastic, aluminum, etc.

The first drive bearing housing 342 includes an outer surface 346 extending circumferentially about the axis A. The outer surface 346 is radially spaced from the first housing cavity 344. The outer surface 346 is designed to engage the seventh axial portion 112g of the wall 108. Specifically, the outer surface 346 of the first drive bearing housing 342 is non-rotatably connected to the seventh axial portion 112g, e.g., via a press-fit connection.

The drive system 300 includes a second drive bearing 350 and a second drive bearing housing 352. The rotor shaft 308 is rotationally supported by the second drive bearing 350. The second drive bearing 350 is non-rotatably connected to the sixth portion 334 of the rotor shaft 308. For example, the second drive bearing 350 may be press-fit onto the rotor shaft 308. The second drive bearing 350 engages the fifth shoulder 332. That is, the fifth shoulder 332 axially constrains the second drive bearing 350 in the second direction d2. The second drive bearing 350 may be substantially identical to the first drive bearing 340.

The second drive bearing housing 352 houses the second drive bearing 350. For example, the second drive bearing housing 352 may extend annularly about the axis A. The second drive bearing housing 352 defines a second drive bearing housing cavity 354. The second drive bearing housing cavity 354 extends circumferentially about the axis A. The second drive bearing housing cavity 354 extends from a first axial side to a second axial side of the second drive bearing housing 352. The second drive bearing 350 is arranged within the second drive bearing housing cavity 354. The second drive bearing housing 352 may be any suitable material, e.g., plastic, aluminum, etc. The second drive bearing housing 352 may include a shoulder 356 disposed in the second drive bearing housing cavity 354 and extending radially inward, i.e., towards the axis A. The second drive bearing 350 may be engaged with the shoulder 356. That is, the shoulder 356 may axially constrain the second drive bearing housing 352 in the second direction d2. The second drive bearing 350 may be slip-fit or press-fit into the second drive bearing housing cavity 354, and facilitates rotation of the rotor shaft 308 relative to the second drive bearing housing 352.

The second drive bearing housing 352 includes an outer surface 358 extending circumferentially about the axis A. The outer surface 358 is radially spaced from the second drive bearing housing cavity 354. The outer surface 358 includes a first portion 360 and a second portion 362. The first portion 360 extends from a first axial side to the second portion 362, and the second portion 362 extends from the first portion 360 towards a second axial side. The first portion 360 of the outer surface 358 is disposed radially outward of the second portion 362. The first portion 360 engages the tenth axial portion 112j. For example, the first portion 360 may be non-rotatably connected to the tenth axial portion 112j, e.g., via a press-fit connection. A transition between the first portion 360 and the second portion 362 of the second drive bearing housing 352 may be axially aligned with the tenth locator surface 114*j*.

The second bearing housing 352 may include a groove extending axially from the first axial side towards the second portion 362. The groove may extend circumferentially about the axis A. The groove may be disposed radially between the second portion 362 and the second drive bearing housing cavity 354. The groove may reduce compression forces on the second drive bearing 350, which can assist in allowing the rotor shaft 308 to rotate relative to the second bearing housing 352.

The second portion 362 is radially spaced from the eleventh axial portion 112*k*. The second portion 362 may include a groove 364 extending circumferentially about the axis A. The groove 364 may extend radially inward from the second portion 362 towards the second drive bearing housing cavity 354. The groove 364 may be axially spaced from the first portion 360. The groove 364 may extend any suitable amount towards the second drive bearing housing cavity 354.

The second portion 362 may include an opening extending axially through the first and second axial sides of the second bearing housing 352. The opening may be designed, i.e., sized and shaped, to receive one or more wires from the electric motor 302. For example, the wires from the electric motor 302 may be routed through the opening to connect the motor 302 to the circuit board(s) 412. The second bearing housing 352 may include a grommet designed to seal the opening around the wires. The grommet may be any suitable material, e.g., rubber.

The first encoder magnet 368*a* is disposed within the second drive bearing housing cavity 354. The second drive bearing housing cavity 354 may be designed, i.e., sized and shaped, such that the second drive bearing housing 352 does not create magnetic interference. That is, the second drive bearing housing 352 may extend annularly about the axis A such that an inner surface of the second drive bearing housing 352 is radially spaced from the first encoder magnet 368*a* by at least a distance that prevents the second drive bearing housing 352 from magnetically interfering with a first sensor 414*a* arranged to detect an angular position of the first encoder magnet 368*a*. The first sensor 414*a* can be described as a rotary position sensor.

The drive system 300 includes a shield 366 connected to the second drive bearing housing 352. The shield 366 may be connected to the second drive bearing housing 352 in any suitable manner, e.g., via fasteners, adhesive, welding, etc. The shield 366 is disposed on an axial side of the second drive bearing housing 352 facing away from the gearbox 200. The shield 366 covers the second drive bearing housing cavity 354 at the axial side. The shield 366 and the second drive bearing housing 352 may prevent fluid communication through the cavity 110, e.g., from one end 104, 106 to another end 104, 106.

The shield 366 may be any suitable material, e.g., plastic, metal, etc., that does not create magnetic interference. The shield 366 may have a thickness determined along the axis A such that the thickness can limit deformation of the shield 366, e.g., due to thermal and/or vibrational effects, while not preventing the first sensor 414*a* from detecting the first encoder magnet 368*a*.

A resilient member 152 is arranged axially between the cover 196 of the wave generator 220 and the first drive bearing housing 342. The resilient member 152 is designed, i.e., sized and shaped, to axially control, i.e., minimize stack-up tolerances of components associated with, the drive system 300 relative to the housing 102. Axially controlling the drive system 300 can increase a likelihood of the first encoder magnet 368*a* being maintained within a predetermined range of the first sensor 414*a*. The predetermined range may be specified by a manufacturer of the sensor, e.g., based on empirical testing to determine a range in which the sensor 414 output satisfies a specified measurement accuracy and/or precision.

The resilient member 152 is engaged with the drive system 300 to bias the drive system 300 in the first direction d1. The resilient member 152 may be further engaged with the strain wave gearbox 200 and/or the housing 102 to bias the drive system 300 in the first direction d1. The resilient member may be any suitable type, e.g., a compression spring, an arc spring, a wave spring, etc.

Figure 6:
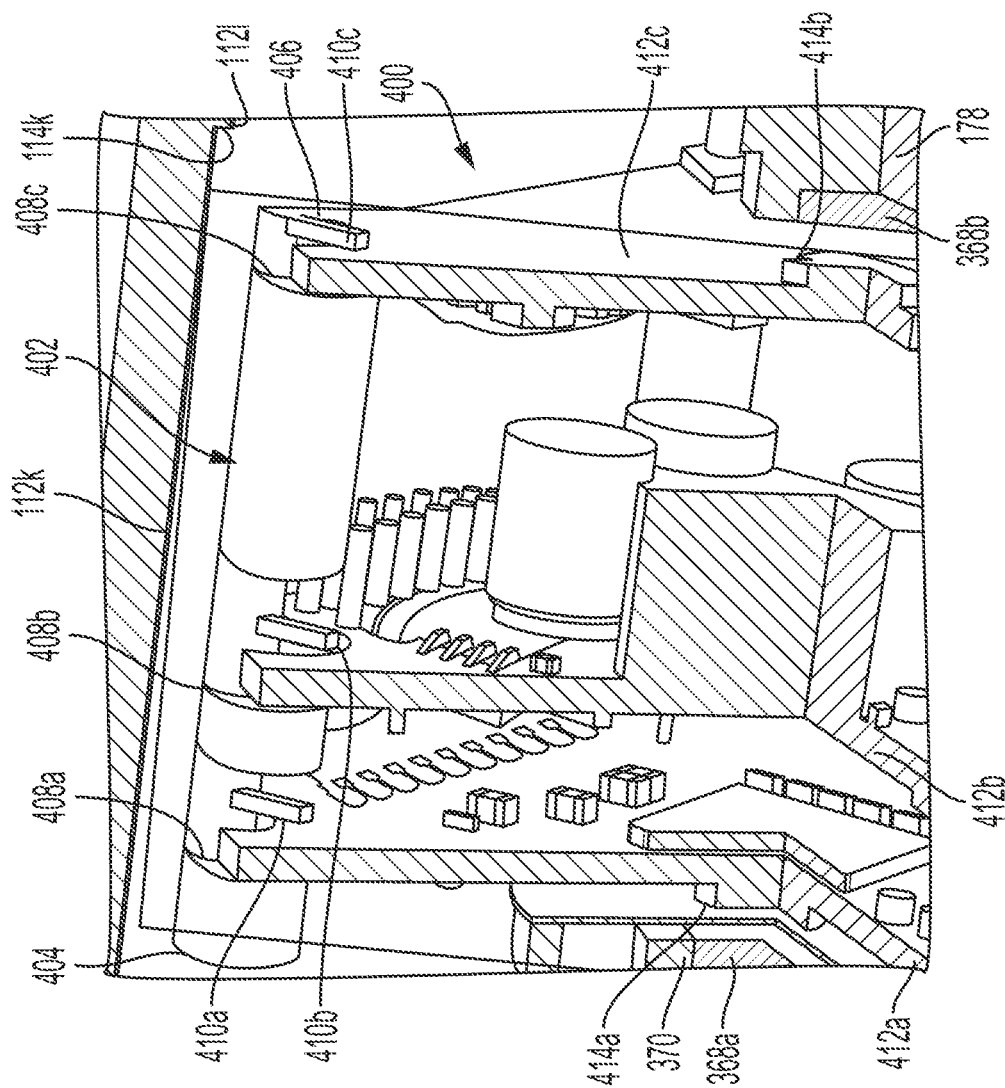
FIG. 6 illustrates a magnified cross-sectional view of another portion of the rotary actuator of FIG. 1.

Turning now to FIG. 6, the rotational controller 400 is disposed between the drive system 300 and the second end 106 of the housing 102. That is, the rotational controller 400 is disposed in the cavity 110. The rotational controller 400 includes sensors 414 and a plurality of circuit boards 412.

A first circuit board 412*a* includes the first sensor 414*a*. The first sensor 414*a* is axially aligned with the first encoder magnet 368*a*. The first sensor 414*a* is an angular position sensor. Specifically, the first sensor 414*a* is configured to detect an angular position of the first encoder magnet 368*a* (arranged on the sleeve 370 of the rotor shaft 308) relative to the axis A. The first sensor 414*a* may be any suitable type of angular position sensor. For example, the first sensor 414*a* may be a Hall effect sensor configured to output a unique angular position over 360° of rotation about the axis A. In such an example, the Hall effect sensor can determine the angular position of the first encoder magnet 368*a* based on detecting a position of the poles relative to the axis A, e.g., according to known techniques.

A second circuit board 412*b* may be referred to as a power electronics circuit board. That is, the second circuit board 412*b* may include one or more devices, such as semiconductor switching devices, e.g., diodes, thyristors, power transistors, etc., a current converter device, etc., for controlling and converting electric power provided to the rotational controller 400, which allows the computer 416 to control the electric motor 302.

A third circuit board 412*c* includes a second sensor 414*b*. The second sensor 414*b* may be substantially identical to the first sensor 414*a* and can also be described as a rotary position sensor. The second sensor 414*b* can be configured to measure absolute position of the idler shaft 154 over a 360 degree range. The third circuit board 412*c* may have a smaller surface area than the first circuit board 412*a* and/or the second circuit board 412*b*.

A plurality of supports 402 support the circuit boards 412 within the cavity 110. Each support 402 includes a first end 404 engaged with the second drive bearing housing 352 and a second end 406 axially spaced from the first end 404. Each support 402 is mounted, e.g., via a press-fit connection, to the second drive bearing housing 352. For example, the second drive bearing 350 may have a plurality of recesses (not shown) circumferentially spaced from each other about the axis A, and each support 402 may be press-fit into one respective recess. The supports 402 may be any suitable material, e.g., plastic.

Each support 402 may include a plurality of loading surfaces 408 spaced from each other along the axis A. Each loading surface 408 may be configured to axially support one respective circuit board 412, as discussed further below. Each support 402 may include a same number of loading surfaces 408 as circuit boards 412. Each loading surface 408 may extend radially relative to the axis A. Each support 402 may include a plurality of fingers 410 axially spaced from each other along the axis A. Each finger 410 may extend obliquely towards the axis A. For example, each finger 410 may extend radially inward and axially towards one respective loading surface 408. Each finger 410 is configured to axially constrain one respective circuit board 412 relative to one respective loading surface 408. The supports 402 are configured to position the first sensor 414a within the predetermined range of the first encoder magnet 368a and to position the second sensor 414b within the predetermined range of the second encoder magnet 368b.

For example, each support 402 may include a first loading surface 408a spaced from the first end 404 and a first finger 410a spaced from the first loading surface 408a in the first direction d1. The first finger 410a extends towards the first loading surface 408a in the second direction d2, and radially inward towards the axis A. The first circuit board 412a may be disposed between the first loading surface 408a and the first finger 410a. Specifically, the first finger 410a can bias the first circuit board 412a against the first loading surface 408a. For example, the first finger 410a may be designed to elastically deform such that the first circuit boards 412a can be inserted between the first loading surface 408a and the first finger 410a. After installation, the first finger 410a can rebound and axially bias the first circuit boards 412a in the second direction d2 to contact the first loading surface 408a.

The first loading surface 408a is spaced from the first end 404 such that the first sensor 414a is disposed within the predetermined range of the first encoder magnet 368a. The components of the rotary actuator 100 are axially constrained, as discussed herein, to maintain the first sensor 414a within the predetermined range of the first encoder magnet 368a.

Each support 402 may include a second loading surface 408b axially spaced from the first finger 410a in the first direction d1. Additionally, each support 402 may include a second finger 410b axially spaced from the second loading surface 408b in the first direction d1. The second finger 410b may extend towards the second loading surface 408b in the second direction d2 and radially inward towards the axis A. The second circuit board 412b may be disposed between the second loading surface 408b and the second finger 410b. The second finger 410b may be axially spaced from the second circuit board 412b. For example, the second finger 410b can be an assembly aid that prevents the second circuit board 412b from being inserted between the second loading surface 408b and the second finger 410b when components of the first circuit board 412a are improperly seated with mating components of the second circuit board 412b.

Each support 402 may include a third loading surface 408c axially spaced from the second finger 410b in the first direction d1. Additionally, each support 402 may include a third finger 410c axially spaced from the third loading surface 408c in the first direction d1. The third finger 410c may be disposed at the second end 406. The third finger 410c may extend towards the third loading surface 408c in the second direction d2 and radially inward towards the axis A. The third circuit board 412c may be disposed between the third loading surface 408c and the third finger 410c. Specifically, the third finger 410c can bias the third circuit board 412c against the third loading surface 408c. The third finger 410c can be substantially identical to the first finger 410a. The third loading surface 408c may be spaced from the first end 404 such that the second sensor 414b is disposed within the predetermined range of a second encoder magnet 368b.

The eleventh axial portion 112k of the cavity 110 that houses the rotational controller 400 may be potted, i.e., filled with a potting compound 182 (see FIG. 1). The potting compound 182 may be any suitable material, e.g., epoxy, urethane, silicone, etc. For example, the potting compound 182 may cover the rotational controller 400 and adhesively seal against the inner surface 184 of the wall 108 of the housing 102. By covering the rotational controller 400, the potting compound 182 can protect the rotational controller 400, and specifically the circuit boards 412 and components thereof, from debris and/or fluid if any should enter the cavity 110. Additionally, the potting compound 182 can provide a means of vibration resistance for the rotational controller 400 and also an enhanced thermal path between the rotational controller 400 and the housing 102 to better dissipate heat. Due to adhesive properties of the potting compound 182, the filling of the groove 364 of the second drive bearing housing 352 and surrounding area with potting compound prevents axial displacement of the second drive bearing housing 352 relative to the housing 102. Such axial fixing prevents axial displacement of the second drive bearing 350, which resides within the second drive bearing housing 352 and is fixed to the rotor shaft 308, and also the first drive bearing 340 which is fixed to the rotor shaft 308.

The potting compound 182 is radially spaced from the second encoder magnet 368b. That is, the potting compound 182 defines a recess 198 within which the second encoder magnet 368b can rotate freely. The recess 198 may be formed during installation of the potting compound 182 into the cavity 110. The potting compound 182 may be axially spaced from the second encoder magnet 368b.

Referring to FIG. 2, it should be noted that the rotational controller 400 and the surrounding potting compound 182 reside within the eleventh axial segment or portion 112k that is defined by a first diameter d1 of the inner surface 184. The tenth axial portion 112j, which is directly adjacent to a first side of the eleventh axial segment or portion 112k is defined by a second diameter d2 of the inner surface 184, and the twelfth axial portion or segment 112l which is directly adjacent to a second side of the eleventh axial segment 112k is defined by a third diameter d3 of the inner surface. The first diameter d1 is greater than the second and third diameters d2, d3. Alternatively stated, the inner surface 184 that resides within the eleventh axial segment 112k extends radially outward relative to the axis A from the adjacent inner surfaces that reside within the respective tenth and twelfth axial segments 112j, 112l.

Figure 7:
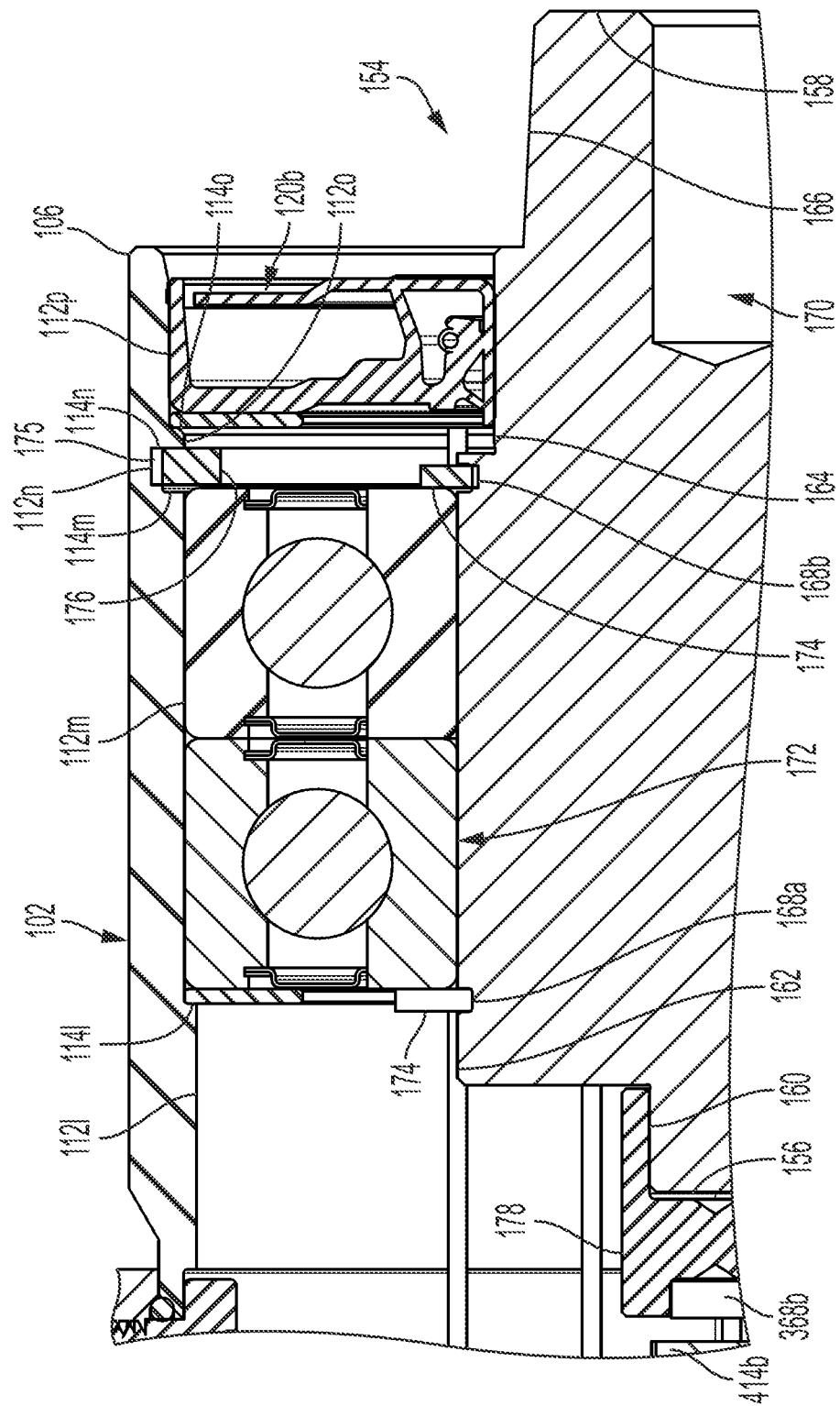
FIG. 7 illustrates a magnified cross-sectional view of another portion of the rotary actuator of FIG. 1.

Turning now to FIG. 7, the rotary actuator 100 may include an idler shaft 154. The rotational controller 400 may be arranged between the idler shaft 154 and the drive system 300. The idler shaft 154 is arranged coaxially with the axis A. The idler shaft 154 extends outwardly through the second end 104 of the cavity 110. That is, the idler shaft 154 is arranged partially within the cavity 110.

The idler shaft 154 includes a first end 156 and a second end 158 spaced from the first end 156 along the axis A. The idler shaft 154 also includes a first portion 160, a second portion 162, a sealing portion 164, and a third portion 166. The first portion 160 extends from the first end 156 to the second portion 162. The first portion 160 extends circumferentially about the axis A. A sleeve 178 is arranged on the first portion 160 of the idler shaft 154. The sleeve 178 may be non-rotatably connected to the idler shaft 154, e.g., via a press-fit connection. The sleeve 178 may extend along the axis A farther than the first portion 160. For example, the sleeve 178 may extend, in the second direction d2, from the second portion 162 beyond the first end 156 of the idler shaft 154. The sleeve 178 may be substantially identical to the sleeve 370.

The sleeve 178 of the idler shaft 154 includes the second encoder magnet 368b. The second encoder magnet 368b is substantially identical to the first encoder magnet 368a. The second encoder magnet 368b may be arranged coaxially with the axis A. The second encoder magnet 368b is non-rotatably connected to the sleeve 178, e.g., in substantially the same manner as discussed above regarding the first encoder magnet 368a being non-rotatably connected to the sleeve 370. The idler shaft 154 is axially constrained, as discussed below, to maintain the second encoder magnet 368b within the predetermined range of the second sensor 414b.

The second portion 162 extends from the first portion 160 to the sealing portion 164. The second portion 162 extends circumferentially about the axis A. The second portion 162 has a larger diameter than the first portion 160. That is, the second portion 162 extends radially outward of the first portion 160. The second portion 162 may include two grooves 168 axially spaced from each other. A first groove 168a may be disposed closer to the first portion 160 than to a second groove 168b. The second groove 168b may be disposed closer to the sealing portion 164 than the first groove 168a. The grooves 168 may extend circumferentially about the axis A, i.e., entirely around the second portion 162.

The sealing portion 164 is disposed radially inward of the second portion 162 relative to the axis A. The sealing portion 164 extends along the axis A from the second portion 162 to the third portion 166. The sealing portion 164 may be designed, i.e., sized and shaped, to engage the second seal 120b.

The third portion 166 extends from the sealing portion 164 to the second end 158. The third portion 166 extends circumferentially about the axis A. The third portion 166 may extend radially inward of the sealing portion 164. The third portion 166 may have a larger diameter than the first portion 160. The third portion 166 may include a blind recess 170 that extends axially from the second end 158 and ends within the sealing portion 164. The recess 170 may extend circumferentially about the axis A.

An idler bearing 172 rotationally supports the idler shaft 154 in the cavity 110. The idler bearing 172 is arranged coaxially with the axis A. The idler bearing 172 may extend annularly about the axis A. The idler bearing 172 may be positioned between the grooves 168. The idler bearing 172 may be any suitable type of bearing, such as a deep groove ball bearing. The idler bearing 172 may be substantially identical to the output bearing 150. The idler bearing 172 may be press-fit onto the second portion 162. The idler bearing 172 can have a slip fit connection or a press-fit connection with the thirteenth axial portion 112m to facilitate rotation of the idler shaft 154 relative to the housing 102.

Inner idler retainers 174 are engaged with the idler shaft 154 and the idler bearing 172. The inner idler retainers 174 constrain the idler bearing 172 axially in the first and second directions d1, d2. The inner idler retainers 174 may be any suitable type of retainer, e.g., a snap ring. Each inner idler retainer 174 is disposed in one respective groove 168.

The outer idler retainer 176 is engaged within the groove 175 of the housing 102 and the idler bearing 172. The outer idler retainer 176 may be any suitable type of retainer, e.g., a snap ring. The outer idler retainer 176 and the inner idler retainers 174 may be a same or different type of retainer.

The grooves 168, 175 may be crimped to axially constrain the idler bearing 172, as previously discussed for the output bearing 150. Additionally, the housing 102 can be crimped, e.g., to minimize the axial clearance between the thirteenth locator surface 114m and the fourteenth locator surface 114n, to axially constrain the idler bearing 172. Axially constraining the idler bearing 172 can control axial clearance between the second encoder magnet 368b and the second sensor 414b, e.g., to maintain the second encoder magnet 368b within the predetermined range of the second sensor 414b.

The second seal 120b is disposed at the second end 106 of the housing 102. The second seal 120b is substantially identical to the first seal 120a. The second seal 120b covers the second end 106 of the housing 102. Specifically, the second seal 120b extends radially from the idler shaft 154 to the housing 102. The idler shaft 154 sealingly rotates relative to the housing 102 via the second seal 120b that seals against the sealing portion of the idler shaft 154 and the inner surface 184 of the housing 102. The second seal 120b prevents fluid communication between the cavity 110 and an environment around the housing 102 through the second end 106.

The rotary actuator 100 may include grease, or the like, disposed in the cavity 110 adjacent to the second seal 120b. The grease may be any suitable type of water-resistant grease. The grease may decrease a likelihood of water intrusion into the cavity 110.

The rotary actuator 100 may include an arm (not shown) disposed external to the cavity 110. The arm extends from the idler shaft 154 to the output shaft 134. The arm is non-rotatably connected to the idler shaft 154 and the output shaft 134. That is, the idler shaft 154 is non-rotatably connected to the output shaft 134 via the arm. Said differently, rotation of the output shaft 134 causes the arm to rotate, which, in turn, causes the idler shaft 154 to rotate in unison with the output shaft 134. Such a connected relationship between the idler shaft 154 and the output shaft 134 enables the second sensor 414b, which detects a rotational position of the idler shaft 154, to also detect a rotational position of the output shaft 134 of the gearbox 200. The arm may be any suitable material. For example, the arm may be a non-corrosive metal, e.g., stainless steel.

Figure 8:
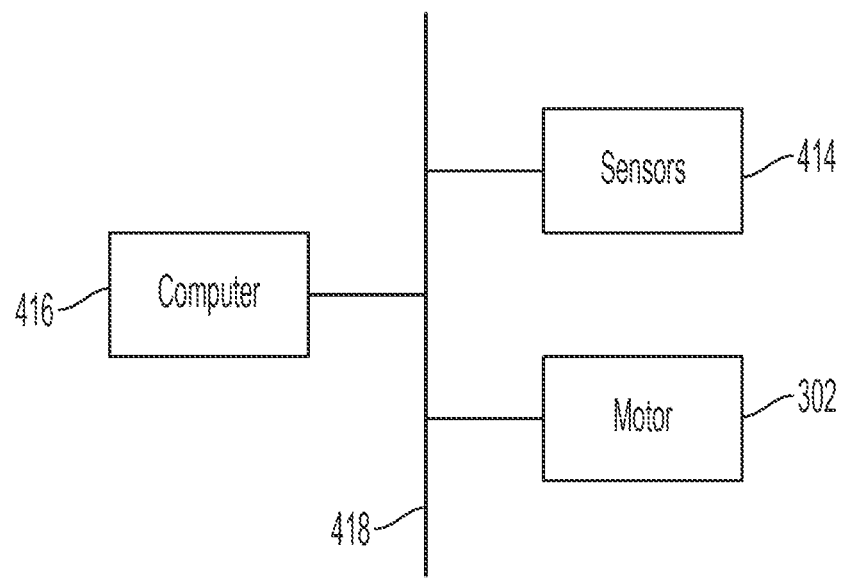
FIG. 8 illustrates a block diagram of an electronic communication network of the rotary actuator of FIG. 1.

Turning now to FIG. 8, the rotational controller 400 may include a computer 416 in electronic communication with the sensors 414 and the electric motor 302 on a communication network 418 via known wired and/or wireless mechanisms. The computer 416 and communication network 418 are part of the rotational controller which resides within the housing 102. Via the communication network 418, the computer 416 may transmit electronic messages to various components in the rotary actuator 100 and/or receive electronic messages from the various components, e.g., sensors 414, the electric motor 302, etc. In addition, the computer 416 may be configured for electronically communicating via the electrical cable 124 with devices outside of the rotary actuator 100.

The computer 416 includes a processor and a memory such as are known. The memory includes one or more forms of computer-readable media, and stores instructions executable by the processor for performing various operations, including as disclosed herein. The computer 416, i.e., the components thereof, may be supported by one or more of the circuit boards 412.

The computer 416 is programmed to receive data from the sensors 414 substantially continuously, periodically, and/or when instructed by a remote computing device. The data includes an angular position of the rotor shaft 308 and an angular position of the idler shaft 154. For example, the first sensor 414a can detect an angular position of the first encoder magnet 368a, and the second sensor 416b can detect an angular position of the second encoder magnet 368b, as discussed above. The angular position of the rotor shaft 308 corresponds to the angular position of the first encoder magnet 368a, and the angular position of the idler shaft 154 corresponds to the angular position of the second encoder magnet 368b. The sensors 414 can then provide the detected angular positions of the encoder magnets 368 to the computer 416, e.g., via the communications network 418. The computer 416 can then provide the angular position of the rotor shaft 308 and/or the angular position of the idler shaft 154 to a remote computing device, e.g., via the electrical cable 124. Additionally, the computer 416 can actuate the electric motor 302 to update the angular position of the rotor shaft 308 such that the angular position of the idler shaft 154 corresponds to a desired angular position, e.g., specified in instructions received via the remote computing device. This two-sensor arrangement can compensate for inherent mechanical backlash that is present within the gearbox 200 or any other drive component.

Upon determining that the angular position of the rotor shaft 308 corresponds to the desired angular position, the computer 416 can compare the angular position of the idler shaft 154 to the angular position of the rotor shaft 308. If the angular position of the idler shaft 154 matches, i.e., is the same value or within a specified margin of error, the angular position of the rotor shaft 308, then the computer 416 can determine that the angular position of the idler shaft 154 corresponds to the desired angular position. In this situation, the computer 416 can stop actuation of the electric motor 302.

If the angular position of the idler shaft 154 differs from, e.g., by more than the specified margin of error, the angular position of the rotor shaft 308, then the computer 416 can determine a difference between the angular position of the idler shaft 154 and the angular position of the rotor shaft 308. The computer 416 can then actuate the electric motor 302 to rotate the rotor shaft 308 to compensate for the difference between the angular position of the idler shaft 154 and the angular position of the rotor shaft 308, e.g., by rotating the rotor shaft 308 in one direction to compensate for a positive difference or in the other direction to compensate for a negative difference. Upon determining that the angular position of the idler shaft 154 corresponds to the desired angular position, the computer 416 can stop actuation of the electric motor 302.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A rotary actuator, comprising:
    a hollow housing including a first end and a second end spaced from the first end along an axis, the hollow housing defining a cavity extending from the first end to the second end;
    an output shaft arranged coaxially with the axis and extending outwardly from the cavity through the first end;
    a drive system disposed in the cavity and drivably connected to the output shaft;
    a gearbox disposed in the cavity and arranged axially between the output shaft and the drive system, the gearbox drivably connected to the drive system and the output shaft;
    an idler shaft arranged coaxially with the axis, the idler shaft extending outwardly from the cavity through the second end;
    a rotational controller disposed in the cavity between the drive system and the idler shaft, the rotational controller:
        configured to actuate the drive system to adjust an angular position of the output shaft; and
        comprising: i) a first sensor configured to detect an angular position of a rotor shaft of an electric motor, and ii) a second sensor configured to detect an angular position of the idler shaft, the first and second sensors being axially spaced from one another.

2. The rotary actuator of claim 1, wherein the hollow housing is a one-piece housing.

3. The rotary actuator of claim 2, further comprising a first seal disposed at the first end and a second seal disposed at the second end, wherein the first and second seals are configured to prevent liquid communication between the cavity and an environment around the hollow housing via the first and second ends.

4. The rotary actuator of claim 3, wherein the rotary actuator is configured to operate when submersed in a liquid.

5. The rotary actuator of claim 1, wherein the drive system includes:
    an electric motor having the rotor shaft;
    a bearing housing defining a bearing housing cavity extending axially through the bearing housing, the rotor shaft extending partially through the bearing housing cavity;
    an encoder magnet connected to the rotor shaft and detectable by the rotational controller, the encoder magnet being disposed within the bearing housing cavity; and
    a shield covering the bearing housing cavity, the shield being disposed between the encoder magnet and the rotational controller.

6. The rotary actuator of claim 5, wherein the bearing housing and the shield are configured to prevent liquid communication through the bearing housing cavity.

7. The rotary actuator of claim 1, wherein the gearbox is a strain wave gearbox.

8. The rotary actuator of claim 1, wherein the first and second sensors are arranged coaxially with the axis.

9. The rotary actuator of claim 1, wherein the drive system and the gearbox are arranged coaxially with the axis.

10. A rotary actuator configured to be submersed in a liquid, the rotary actuator comprising:

a hollow housing having:
   a first sealed end and a second sealed end;
   a longitudinal cavity extending from the first sealed end to the second sealed end such that liquid intrusion into the longitudinal cavity is prevented via the first sealed end and the second sealed end;
a rotational output shaft extending outwardly from the longitudinal cavity through the first sealed end;
a drive system disposed within the longitudinal cavity and drivably connected to the rotational output shaft;
a gearbox disposed within the longitudinal cavity and arranged axially between the rotational output shaft and the drive system;
a rotational idler shaft extending outwardly from the longitudinal cavity through the second sealed end;
a first sensor configured to detect an angular position of a rotational input shaft of the gearbox; and
a second sensor configured to detect an angular position of the rotational output shaft.

11. The rotary actuator of claim 10, further comprising: i) a plurality of axial segments defining a plurality of inner diameters of the longitudinal cavity, and ii) a rotational controller arranged within a first one of the plurality of axial segments defining a first inner diameter, and
   a second one of the plurality of axial segments directly adjacent to the first one of the plurality of axial segments defines a second inner diameter; and
   a third one of the plurality of axial segments directly adjacent to the first one of the plurality of axial segments defines a third inner diameter; and
   the second and third inner diameters are smaller than the first inner diameter.

12. The rotary actuator of claim 10, further comprising a rotational controller arranged between the drive system and the rotational idler shaft.

13. The rotary actuator of claim 10, further comprising:
   an opening in the hollow housing axially arranged between the first and second sealed ends of the hollow housing; and
   an electrical cable extending through the opening and configured for electronic communication with the rotary actuator.

14. The rotary actuator of claim 12, wherein:
the drive system includes an electric motor; and
the rotational controller is configured to cooperate with the first sensor and the second sensor so as to control the electric motor.

15. The rotary actuator of claim 10, wherein the rotational idler shaft is non-rotatably connected to the rotational output shaft.

16. The rotary actuator of claim 10, wherein the second sensor is configured to detect an angular position of the rotational idler shaft.

17. The rotary actuator of claim 10, further comprising a rotational controller arranged within the longitudinal cavity between the drive system and the idler shaft, the rotational controller: i) configured to control the drive system, and ii) comprising a first circuit board corresponding to the first sensor and a second circuit board corresponding to the second sensor.

18. The rotary actuator of claim 17, wherein the rotational controller further comprises a third circuit board comprising power electronics for controlling the drive system.

19. A rotary actuator configured to be submersed in a liquid, the rotary actuator comprising:
   a hollow housing having:
      a first sealed end and a second sealed end;
      a longitudinal cavity extending from the first sealed end to the second sealed end such that liquid intrusion into the longitudinal cavity is prevented via the first sealed end and the second sealed end;
      a wall; and,
      an opening extending through the wall; and
   a rotational output shaft extending outwardly from the longitudinal cavity through the first sealed end;
   a drive system disposed within the longitudinal cavity and drivably connected to the rotational output shaft;
   a gearbox disposed within the longitudinal cavity and arranged axially between the output shaft and the drive system;
   a rotational idler shaft extending outwardly from the longitudinal cavity through the second sealed end, the rotational idler shaft non-rotatably connected to the rotational output shaft;
   a sensor configured to detect an angular position of a rotational input shaft of the gearbox; and
   a circuit board corresponding to the sensor; and
   an electrical cable extending through the opening and electrically connected to the circuit board.

20. The rotary actuator of claim 19, wherein the drive system further comprises an electric motor, and a shaft of the electric motor is the rotational input shaft.

* * * * *